US008659913B2

(12) United States Patent
van Dijk et al.

(10) Patent No.: US 8,659,913 B2
(45) Date of Patent: Feb. 25, 2014

(54) ELECTROMAGNETIC LIMITER AND A USE OF AN ELECTROMAGNETIC LIMITER

(75) Inventors: Raymond van Dijk, Amsterdam (NL); Frank Edward van Vliet, Heemstede (NL); Stefania Monni, Leiden (NL)

(73) Assignee: Nederlandse Organisatie voor toegepast-natuurwetenschappelijk onderzoekTNO, Delft (NL)

( * ) Notice: Subject to any disclaimer, the term of this patent is extended or adjusted under 35 U.S.C. 154(b) by 134 days.

(21) Appl. No.: 12/995,149

(22) PCT Filed: May 28, 2009

(86) PCT No.: PCT/NL2009/050298

§ 371 (c)(1),
(2), (4) Date: Feb. 15, 2011

(87) PCT Pub. No.: WO2009/145631

PCT Pub. Date: Dec. 3, 2009

(65) Prior Publication Data

US 2011/0127081 A1 Jun. 2, 2011

(30) Foreign Application Priority Data

May 28, 2008 (EP) .................................... 08157132

(51) Int. Cl.
*H05K 9/00* (2006.01)

(52) U.S. Cl.
USPC .......................................... 361/818; 361/816

(58) Field of Classification Search
USPC ................. 174/377, 350, 250, 261; 333/109; 343/850; 361/816, 818; 342/1
See application file for complete search history.

(56) References Cited

U.S. PATENT DOCUMENTS

| | | | | | |
|---|---|---|---|---|---|
| 4,361,819 | A | * | 11/1982 | Sillard et al. | 333/109 |
| 4,922,253 | A | | 5/1990 | Nathanson et al. | |
| 5,237,328 | A | | 8/1993 | Dorey et al. | |
| 5,266,963 | A | * | 11/1993 | Carter | 343/850 |
| 5,619,366 | A | | 4/1997 | Rhoads et al. | |
| 2007/0085757 | A1 | | 4/2007 | Sievenpiper | |
| 2007/0242785 | A1 | | 10/2007 | Thudor et al. | |

FOREIGN PATENT DOCUMENTS

| | | | |
|---|---|---|---|
| GB | 2 254 191 | A | 9/1992 |
| GB | 2 266 995 | A | 11/1993 |
| WO | WO 2005/125034 | A1 | 12/2005 |

* cited by examiner

*Primary Examiner* — Hoa C Nguyen
*Assistant Examiner* — Ahmad D Barnes
(74) *Attorney, Agent, or Firm* — Kilpatrick Townsend & Stockton LLP

(57) ABSTRACT

The invention relates to an electromagnetic limiter. The limiter comprises a multilayer having an electrically conducting pattern superposed on a dielectric structure. Further, the multilayer is provided with at least one electromagnetically transparent aperture that is electromagnetically transparent for plane wave incidence. In addition, the limiter comprises a non-controlled non-linear structure interconnecting opposite edges of the electromagnetically transparent aperture.

17 Claims, 6 Drawing Sheets

ELECTROMAGNETIC LIMITER AND A USE OF AN ELECTROMAGNETIC LIMITER

CROSS-REFERENCES TO RELATED APPLICATIONS

This application is a National Stage of International Application No. PCT/NL2009/050298, filed May 28, 2009, and which claims the benefit of European Patent Application No. 08157132.5, filed May 28, 2008, the disclosures of which are incorporated herein by reference.

The invention relates to an electromagnetic limiter.

Electromagnetic limiters are known to protect sensitive electronic parts of radar receiver equipment in case of a relatively strong electromagnetic field incident upon the radar. In the absence of such an electromagnetic limiter, sensitive electronic parts that are arranged directly behind the radar antenna can be damaged, possible irreparably.

Such electromagnetic limiters comprise an electrical circuit having reactive elements as well as one or more non-linear components, e.g. implemented in micro strip technology, designed for absorbing and/or reflecting high energetic electromagnetic waves.

However, the use of such electromagnetic limiters in a phased array antenna is relatively expensive and requires additional room for a single phased array receiving element due to the size of the limiter.

It is an object of the invention to provide an electromagnetic limiter, wherein the disadvantages identified above are reduced. In particular, the invention aims at obtaining an electromagnetic limiter that is apt to apply in combination with phased array antennas. Thereto, according to the invention, the electromagnetic limiter comprises a multilayer having an electrically conducting pattern superposed on a dielectric structure wherein the multilayer is further provided with at least one aperture that is electromagnetically transparent for plane wave incidence, and wherein the limiter further comprises an uncontrolled non-linear structure interconnecting opposite edges of the electromagnetically transparent aperture.

By providing an uncontrolled non-linear structure interconnecting opposite edges of the electromagnetically transparent aperture, an incident field having a relatively low energy component may in principle pass since the non-linear structure does not significantly interfere with the incident field due to the macroscopic dimensions of the non-linear structure, provided that the multilayer is designed to be substantially transparent for incident fields in the spectral area at hand. In case of an incident field having a relatively high energy component, the non-linear structure will form an electrically conducting section, thereby providing a conductor that forms a new edge of the electromagnetically transparent aperture and virtually reduces the size of the aperture. As a result, the filter characteristic of the multilayer dramatically changes and the incident field is mainly reflected. Any incident field propagating through the multilayer is significantly attenuated, as desired, thereby reducing the chance that electronic components that are shielded by the limiter, are damaged.

Thus, by locating a single limiter according to the invention before the antenna, between the incident field and an antenna, the limiting feature is integrally obtained without the use of a multiple set of separate limiters, thereby saving space, components and manufacturing costs in phased array antennas. In addition, a limiter according to the invention can easily be used in already existing products, simply by arranging the limiter as a front end before a transmitter/receiver provided with electronic equipment to be protected.

It is noted that a non-linear structure is to be understood as a structure having a non-linear, optionally frequency depending voltage/current characteristic, in other words its impedance is not constant and/or the voltage/current dependence is non-Ohmic. As an example, the non-linear structure is implemented using one or a multiple number of diodes, such as a single positive-intrinsic-negative (PIN) diode or two anti-parallel placed fast diodes. A diode can e.g. be formed as a separate discrete diode element or by using a PN junction of a transistor.

Also externally controllable diode structures are known enabling to protect against an incident field. However, such diode structures are not useful in the case of an unexpected high energetic electromagnetic wave, such as a sudden burst of electromagnetic energy impinging the structure.

It is further noted that patent publication U.S. Pat. No. 4,316,819 discloses a passive semiconductor limiter for interconnection between a receiving antenna and a low noise amplifier. The limiter comprises a dielectric structure including two parallel micro-strip lines that are connected via a slot line that is orthogonal to the lines for guiding electromagnetic waves in the plane wherein the limiter extends. Further, the limiter is provided with a pair of diodes having the same polarity and placed on each edge of the slot line facing one another.

Advantageously, the multilayer including the electrically conducting pattern forms a frequency selective surface. Thus, by integrating the limiter with a frequency selective surface, there is no need to use a frequency selective surface separate from the limiter, thereby further saving components.

It is noted that frequency selective surfaces per se are known for filtering specific radar bands of incident electromagnetic fields, both of the band pass type and the band stop type.

In order to form a frequency selective surface, the multilayer might be provided with an array of apertures that are electromagnetically transparent for plane wave incidence. The apertures of the array can be arranged in a regular pattern, so as to obtain a property of filtering impinging electromagnetic waves in frequency and/or angle.

In an advantageous embodiment according to the invention, the non-linear structure comprises two diodes that are arranged mutually anti-parallel. By arranging diodes in an anti-parallel way both a negative and positive part of a harmonic incident wave is attenuated, so that a net passing electromagnetic wave has a significantly reduced power. In principle, the non-linear structure might also comprise a single diode, thereby effectively clipping at a negative or positive part of the harmonic incident wave. As a result, merely substantially half of the incident power is transmitted through the limiter. Alternatively, a single PIN diode can be used, thus at high frequencies simulating a resistor.

The invention also relates to the use of an electromagnetic limiter.

Other advantageous embodiments according to the invention are described in the following claims.

By way of example only, embodiment of the present invention will now be described with reference to the accompanying figures in which FIG. 1*a* shows a schematic view of a first embodiment of an electromagnetic limiter according to the invention in a first state;

FIG. 1*b* shows a first schematic partial cross sectional side view of the electromagnetic limiter of FIG. 1*a;*

FIG. 1*c* shows a second schematic partial cross sectional side view of the electromagnetic limiter of FIG. 1*a;*

It is noted that the figures show merely preferred embodiments according to the invention. In the figures, the same reference numbers refer to equal or corresponding parts.

Figure 1A:
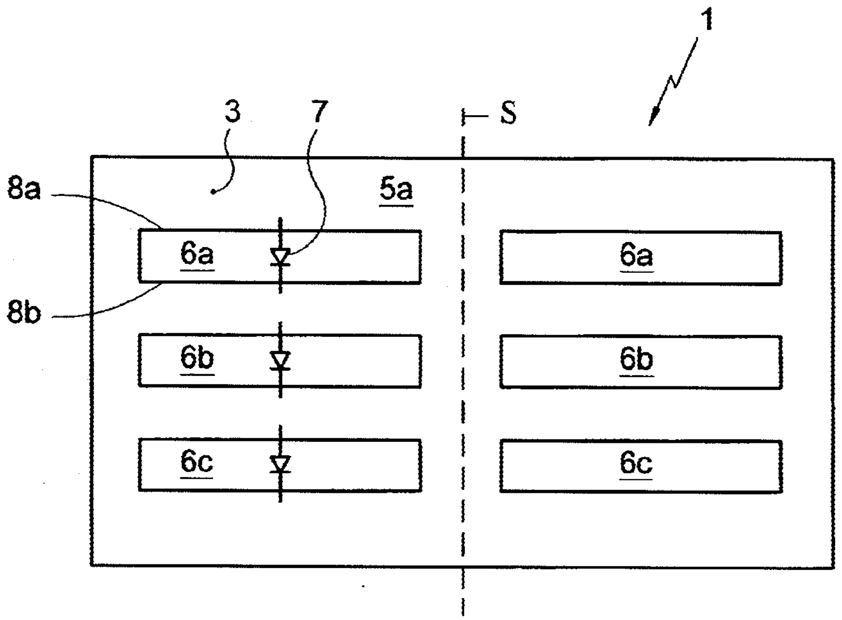
Figure 1B:
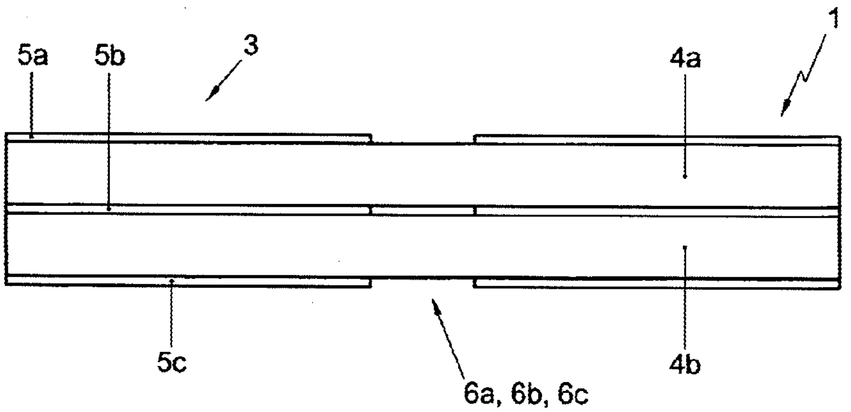
Figure 1C:
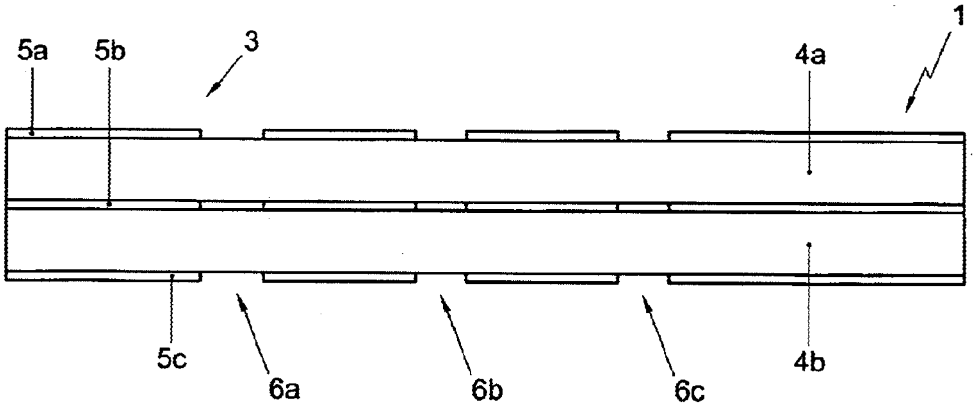

FIG. 1*a* shows a schematic view of a first embodiment of an electromagnetic limiter 1 according to the invention. The limiter 1 comprises a frequency selective surface provided with an additional structure. The frequency selective surface has a multilayer 3 comprising a multiple number of dielectric structures 4*a*, 4*b* sandwiched between electrically conducting patterns 5*a*, 5*b*, 5*c*, see FIGS. 1*b* and 1*c* showing a first and second partial cross sectional view of the limiter 1. The shown limiter 1 comprises three electrically conducting patterns 5*a*, 5*b*, 5*c* and two dielectric layers 4*a*, 4*b*. Obviously, also other numbers of electrically conducting patterns and/or dielectric layers can be applied for providing at least one electrically conducting pattern superposed on a dielectric structure. The thickness of a dielectric 4*a*, 4*b* and/or the specific dielectric permittivity can be designed to obtain a desired specific spectral characteristic of the frequency selective surface. As a specific example, the dielectric structures are composed of air wherein the electrically conducting patterns are fixed at predefined mutual distances.

The multilayer 3 is further provided with at least one electromagnetically transparent aperture 6*a*, 6*b*, 6*c* having a particular size and shape that partially contribute to the spectral characteristic of the frequency selective surface, such as band pass filter. Though, theoretically, the multilayer 3 may be provided with a single electromagnetically transparent aperture, in practice a multiple number of electromagnetically transparent apertures are applied to obtain a desired band pass filter characteristic. As an example, the multiple apertures are arranged as an array, e.g. as a regular matrix. The multiple apertures can be provided as a repeated pattern. In a practical embodiment, the electromagnetically transparent apertures 6*a*, 6*b*, 6*c* are formed by an opening in an upper conductive pattern 5*a*. The multilayer 3 shown in FIG. 1*a* is provided with three apertures 6*a*, 6*b*, 6*c*. As noted, also another number of apertures can be applied, e.g. several tens of apertures. The frequency selective surface can be designed to transmit EM waves in a certain frequency band, e.g. micro waves. Obviously, also EM waves having other frequencies may be chosen to be transmitted by the frequency selective surface. As an example, EM waves around circa 2, 4, 6, 8 or 10 GHz can be transmitted through the frequency selective surface. Further, the frequency selective surface, also called FSS, may be designed to transmit a multiple number of frequency bands.

The apertures 6*a*, 6*b*, 6*c* are transparent for electromagnetic plane waves incident on the limiter 1. When such an incident plane wave impinges the limiter, the plane wave has a non-zero component oriented transversely with respect to the plane wherein the multilayer extends.

The multilayer has a substantially uniform cross section outside the apertures. As such, apart from the apertures, the multilayer sandwiched structure is mainly invariant in directions wherein the multilayer extends. In this respect it is noted that the multilayer may comprise cross sectional deviations due to imperfections in the manufacturing process or for obtaining desired spectral and/or angular filtering properties.

The electrically conducting patterns can be constructed from metal plates wherein the above-mentioned apertures 6 have been provided, e.g. by using etching techniques.

In addition, the limiter 1 further comprises a non-controlled non-linear structure interconnecting opposite edges 8*a*, 8*b* of the electromagnetically transparent aperture 6*a*, 6*b*, 6*c*. For explanatory purposes, the non-linear structure as shown in FIG. 1*a* has been implemented as a single PIN diode 7 connecting opposite edges of an aperture 6*a*.

On the left-handed side of FIG. 1*a*, to the left of a split line S, the situation is shown from a circuit point of view. On the right-handed side of FIG. 1*a*, to the right of the split line S, the situation is shown from an electromagnetic point of view in a frequency range wherein the frequency selective surface is, in principle, transparent for an incoming wave. Under normal conditions, in a first state, i.e. when the electrical field strength of an incoming wave is less than a predetermined threshold, the diode 7 is substantially transparent and the incoming wave faces the entire aperture 6*a*, 6*b*, 6*c*, as shown in FIG. 1*a*. The wave is able to pass the surface selective surface.

Figure 2:
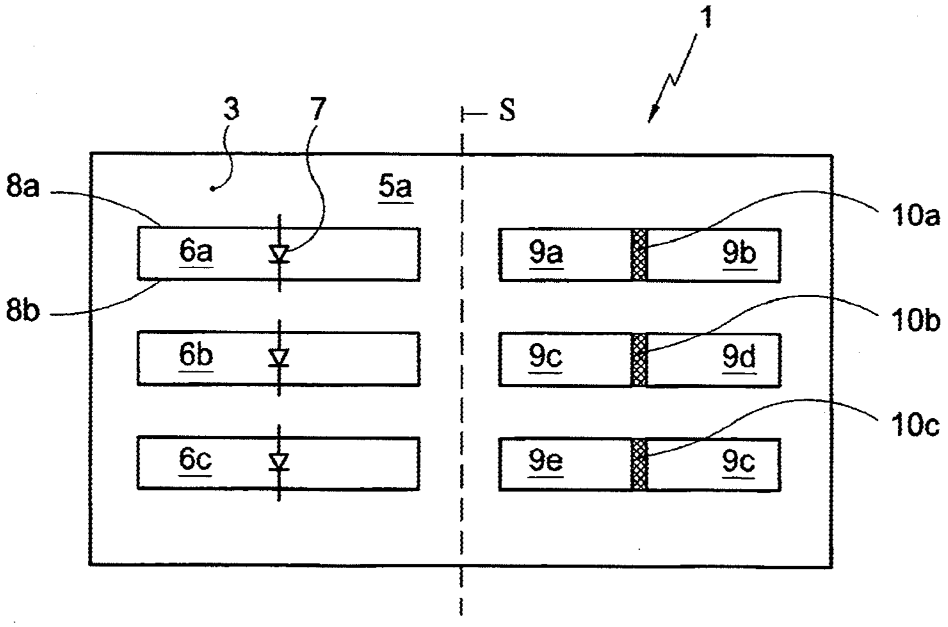
FIG. 2 shows a schematic view of the electromagnetic limiter of FIG. 1 in a second state.

In a second state of the limiter 1, shown in FIG. 2, the situation is different. Here, the electrical field strength of the incoming wave is larger than the predetermined threshold providing a substantial voltage over the diode 7, thus causing the diode 7 to conduct an electrical current. As a result, the spectral behaviour of the surface selective surface changes, so that a high attenuation is realized for incoming waves at a particular frequency that normally pass without substantial attenuation. On the right-handed side of FIG. 2, to the right of the split line S, the situation is shown from an electromagnetic point of view in a frequency range wherein the frequency selective surface is, in principle, transparent for an incoming wave. However, due to the electrically conducting diode 7, the diode acts as a further aperture edge 10*a*, 10*b*, 10*c*, thereby virtually dividing the physical aperture 6*a*, 6*b*, 6*c* into two smaller apertures 9*a*, 9*b*; 9*c*, 9*d*; 9*e*, 9*f*, respectively.

By the presence of the uncontrolled non-linear structure 7, a field strength dependent frequency selective surface is obtained for limiting incoming waves in an adaptive way. The uncontrolled non-linear structure is passive from a circuit point of view, as the components of the structure can neither be controlled manually nor by means of a controlled switch structure. The non-linear structure is free of external control interconnections, so that active, wired control of the non-linear structure is not possible. As the electromagnetic behaviour of the uncontrolled non-linear structure 7 is sensitive to the field strength of incoming waves, a passive, though field strength dependent, adaptive limiter is provided that is able to dynamically limit electromagnetic field signals passing through the surface selective surface. Advantageously, the limiter is transparent under normal, low power incident field conditions, and is arranged for adaptively becoming active during risky conditions when the incident field power exceeds a predetermined threshold.

It is noted that in a practical implementation of the non-linear structure, two diodes can be present, arranged mutually anti-parallel, thereby providing a limiting effect both during a positive and a negative signal period of the incoming electromagnetic wave. In a further practical implementation, other non-controlled non-linear structures can be used, wherein the structure is, in principle, mainly electro-magnetically transparent in the frequency band of interest, viz. in which frequency band the frequency limiting surface transmits an EM wave, i.e. wherein the structure does not form an electrically conductive path across the aperture when a relatively low voltage difference is applied across its terminals, and wherein the structure forms at least partially an electrically conductive path when a voltage difference is applied having an amplitude exceeding a predefined value. As an example, a PIN diode can be employed.

In the embodiment shown in FIGS. 1*a*, 1*b* and 2, the apertures 6 are slot-shaped wherein the non-linear structure interconnects the long sides 8*a*, 8*b* of the slot 6 substantially halfway. As a consequence, the diode will be electrically conducting at a relatively low field strength since a maximum potential difference at opposite edges is generally halfway the long sides. The limiting feature of the limiter is thus already obtained when the field strength of the incoming wave is not extremely high. Alternatively, other positions of the non-linear structure can be used, such as at ⅓ of the long side length.

Figure 3:
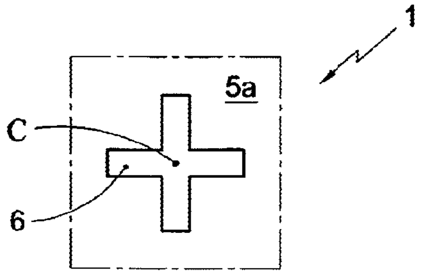
FIG. 3 shows a schematic enlarged view of a detail of a second embodiment of an electromagnetic limiter according to the invention.
Figure 4:
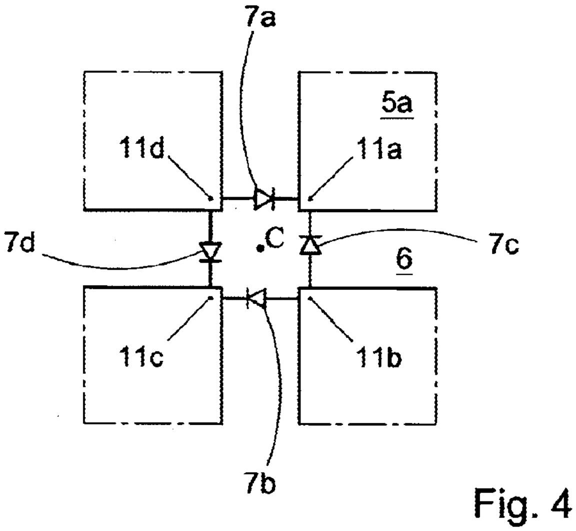
FIG. 4 shows a schematic enlarged partial view of the limiter in FIG. 3.

FIG. 3 shows a schematic enlarged view of a detail of a second embodiment of an electromagnetic limiter 1 according to the invention. Here, the electromagnetically transparent aperture 6 is cross-shaped. The non-linear structure interconnects edge corners 11*a*, 11*b*, 11*c*, 11*d* adjacent to the centre C of the cross, as can be seen in FIG. 4 showing a schematic enlarged partial view of the cross-shaped aperture 6 of the limiter 1 in FIG. 3. The non-linear structure comprises two pairs of mutually anti-parallel arranged diodes 7*a*, 7*b*; 7*c*, 7*d*. Each pair of diodes 7*a*, 7*b*; 7*c*, 7*d* is able to limit a particular polarization type of incoming waves. As a consequence, a first polarization of a wavefield can be limited while a second, perpendicular polarization of the wavefield is transmitted substantially without attenuation since a single pair of diodes is able to merely block in a virtual manner two legs of the cross while the further two legs remain electromagnetically intact.

Figure 5:
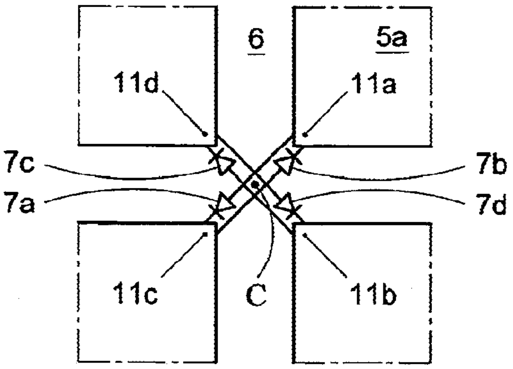
FIG. 5 shows a schematic enlarged view of a detail of a third embodiment of an electromagnetic limiter according to the invention.

FIG. 5 shows a schematic enlarged partial view of a third embodiment of an electromagnetic limiter 1 according to the invention wherein the non-linear structure comprises two pairs of diodes 7*a*, 7*b*; 7*c*, 7*d* that are arranged mutually transversely, so that both polarizations of the incoming wavefield are limited if the field strength in a particular polarization is above the predetermined threshold, since a conducting diode virtually divides both elongated crossing slots of the cross.

In principle, also other shapes of apertures can be applied, such as triangles, discs or elongated shaped apertures. It is noted that ends of the non-linear structure are electrically connected to the electrically conducting pattern 5 of the multilayer 3, thereby enabling an electrical current to flow.

Figure 6:
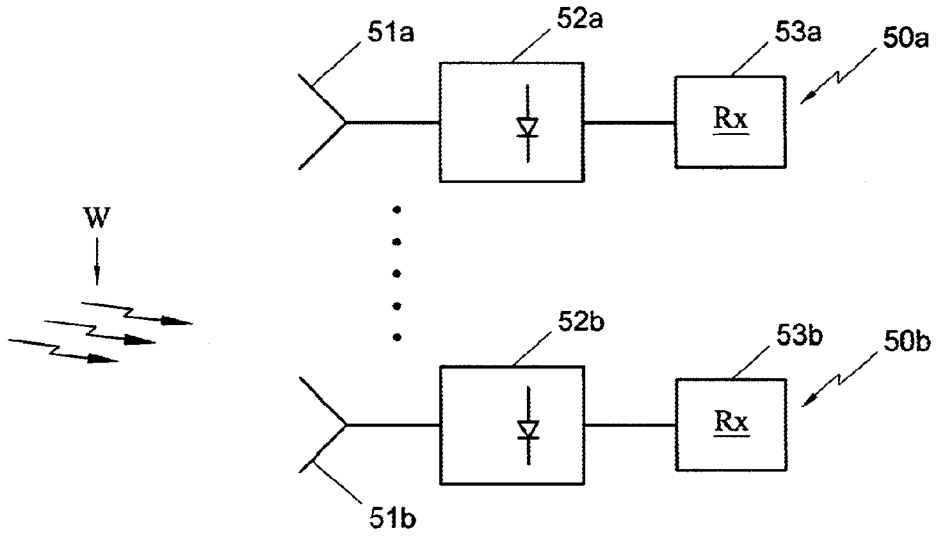
FIG. 6 shows a scheme of a prior art limiter configuration.

FIG. 6 shows a scheme of a limiter configuration known from the prior art. Here, a multiple number of receiving structures 50*a,b* is arranged for receiving incident electromagnetic waves. Each receiving structure 50*a,b* includes an antenna 51*a,b* and a receiver front-end 53*a,b* that are interconnected via a corresponding guided wave limiter 52*a,b*. Such a guided wave limiter 52*a,b* is arranged for limiting electrical currents that are generated by received electromagnetic waves that have a relatively strong amplitude, thus avoiding damage in the receiver front end 53*a,b*.

Figure 7:
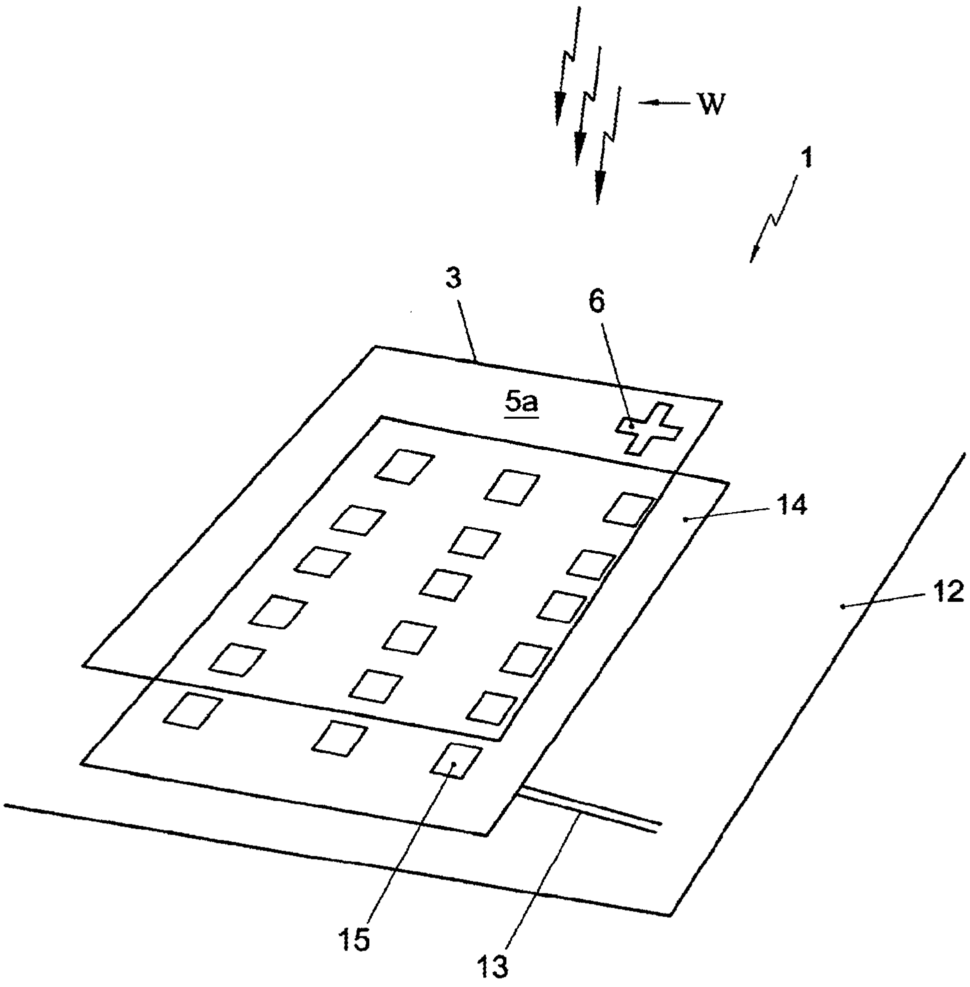
FIG. 7 shows a schematic perspective view of a first arrangement comprising an electromagnetic limiter according to the invention.

FIG. 7 shows a schematic perspective view of a first arrangement comprising an electromagnetic limiter 1 according to the invention. The limiter 1 is arranged before a phased array antenna for sending and/or receiving radar signals. The phased array antenna comprises a multiple number of phased array receivers 15 positioned on a printed circuit board 12. Electronic equipment is connected to the individual phased array receivers 15 to process the received electrical signals. Further, electronic signals can be transmitted to further processing tools on a carrier 12 via a communication channel 13. By arranging the limiter 1 between an incident wave W and the phased array antenna, the electronic equipment is protected for excessive currents and/or potentials differentials. Similarly, by arranging the electronic equipment behind the limiter 1, substantially outside a direct incident field W, the electronic equipment can be protected against high intensity impinging electromagnetic fields.

Figure 8:
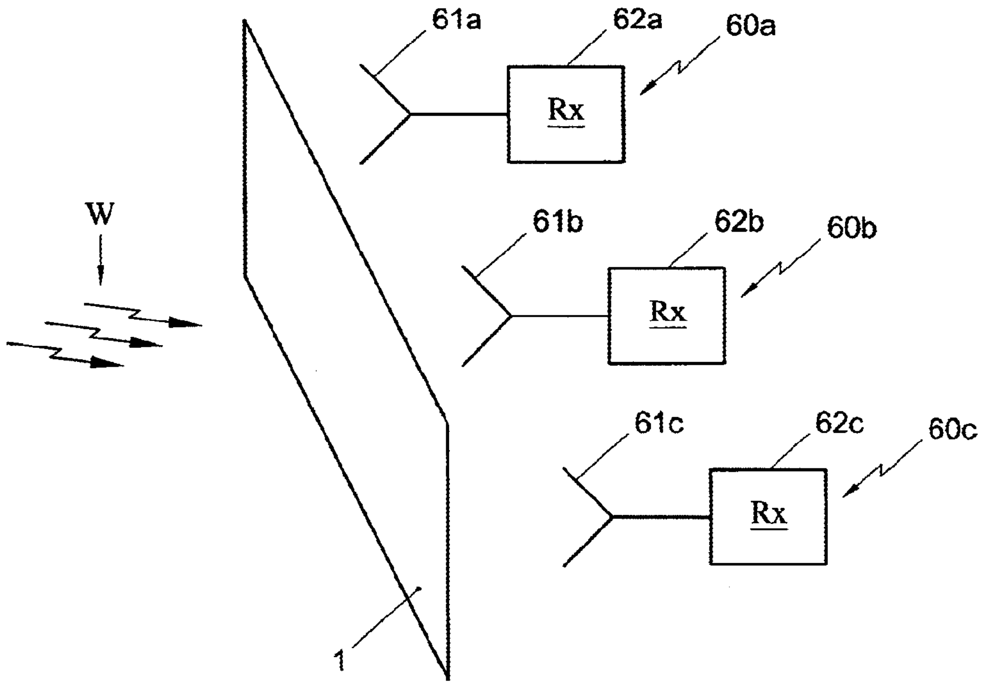
FIG. 8 shows a schematic perspective view of a second arrangement comprising an electromagnetic limiter according to the invention.

FIG. 8 shows a schematic perspective view of a second arrangement comprising an electromagnetic limiter 1 according to the invention. In the view, a typical use of the limiter 1 is shown. Here, the limiter 1 including the multilayer forming a frequency selective surface is located between the impinging electromagnetic wave W and the receiving structures 60*a,b,c*. Each receiving structure 60*a,b,c* comprises an antenna 61*a,b,c* and a receiver front-end 62*a,b,c* that are directly interconnected. In the shown arrangement, the receiving structures 60*a,b,c* is protected against high intensity incident electromagnetic fields.

Thus, the limiter 1 according to the invention can be used in front of a radar receiver/transmitter. The frequency selective surface can be formed as a flat plane or otherwise, e.g. as a conformal plane. Further, the limiter 1 can be arranged in front of any type of radar or communication receiver, or in front of any receiver of electromagnetic radiation.

The invention is not restricted to the embodiments described herein. It will be understood that many variants are possible.

In principle, the limiter can not only be used for protecting electronic means but also for protecting living beings by positioning them in a space that is at least partially surrounded by the described panels.

Further, instead of using the limiter to protect equipment against external electromagnetic fields, also external equipment can be protected against an internal electromagnetic source, e.g. by at least covering a relatively strong electromagnetic source by the limiter.

Other such variants will be obvious for the person skilled in the art and are considered to lie within the scope of the invention as formulated in the following claims.

The invention claimed is:

1. A method of protecting electronic equipment or another object sensitive to strong electromagnetic radiation with an electromagnetic limiter, comprising positioning the object in a space that is at least partially surrounded by the electromagnetic limiter such that the electromagnetic limiter is located before the object, between incident electromagnetic radiation and the object, the electromagnetic limiter comprising a multilayer having an electrically conducting pattern superposed on a dielectric structure wherein the multilayer is further provided with at least one aperture that is electromagnetically transparent for plane wave incidence, the dielectric structure having a substantially uniform cross section outside the aperture, wherein the electromagnetic limiter further comprises a non-controlled non-linear structure interconnecting opposite edges of the electromagnetically transparent aperture.

2. A method according to claim 1 wherein the electromagnetic limiter is arranged in front of a radar antenna and wherein electronic equipment is interconnected to a receiving unit of the radar antenna.

3. A method according to claim 1 wherein electronic equipment is arranged behind the electromagnetic limiter, substantially outside a direct incident field.

4. A method according to claim 1, wherein a relatively strong electromagnetic source is at least partially covered by the electromagnetic limiter.

5. An electromagnetic limiter, comprising a multilayer having an electrically conducting pattern superposed on a dielectric structure wherein the multilayer is further provided with at least one aperture that is electromagnetically transparent for plane wave incidence, the dielectric structure having a substantially uniform cross section outside the aperture, and wherein the electromagnetic limiter further comprises a non-controlled non-linear structure interconnecting opposite edges of the electromagnetically transparent aperture.

6. An electromagnetic limiter according to claim 5, wherein the multilayer including the electrically conducting pattern forms a frequency selective surface.

7. An electromagnetic limiter according to claim 5, wherein the multilayer is provided with an array of apertures that are electromagnetically transparent for plane wave incidence.

8. An electromagnetic limiter according to claim 5, wherein the non-linear structure comprises a diode.

9. An electromagnetic limiter according to claim 5, wherein the non-linear structure comprises two diodes that are arranged mutually anti-parallel.

10. An electromagnetic limiter according to claim 5, wherein the electromagnetically transparent aperture is slot-shaped and wherein the non-linear structure interconnects the long sides of the slot substantially halfway.

11. An electromagnetic limiter according to claim 5, wherein the electromagnetically transparent aperture is cross-shaped and wherein the non-linear structure interconnects edge corners adjacent to the centre of the cross.

12. An electromagnetic limiter according to claim 5, wherein the non-linear structure comprises two diodes that are arranged mutually transversely.

13. An electromagnetic limiter according to claim 5, wherein the non-linear structure is electrically connected to the electrically conducting pattern.

14. An electromagnetic limiter according to claim 5, wherein the non-linear structure is free of external control interconnections.

15. An electromagnetic limiter according to claim 5, wherein the multilayer is further provided with a multiple number of electromagnetically transparent apertures.

16. An electromagnetic limiter according to claim 5, wherein the multilayer comprises a multiple number of dielectric structures sandwiched between electrically conducting patterns.

17. An electromagnetic limiter according to claim 5, wherein the dielectric structures have a mutually different thickness and/or dielectric permittivity.

* * * * *

UNITED STATES PATENT AND TRADEMARK OFFICE

CERTIFICATE OF CORRECTION

PATENT NO. : 8,659,913 B2
APPLICATION NO. : 12/995149
DATED : February 25, 2014
INVENTOR(S) : van Dijk et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 276 days.

Signed and Sealed this
Twenty-ninth Day of September, 2015

Michelle K. Lee

Michelle K. Lee
*Director of the United States Patent and Trademark Office*